United States Patent [19]
Cadoret et al.

[11] Patent Number: 4,468,278
[45] Date of Patent: Aug. 28, 1984

[54] PROCESS FOR MONO-CRYSTAL GROWTH IN A CLOSED TUBULAR CHAMBER

[75] Inventors: Robert M. M. H. Cadoret, Chamalieres; Jean E. M. Omaly, Royat; Marc A. Robert, Aurillac, all of France

[73] Assignee: Centre National d'Etudes Spatiales, France

[21] Appl. No.: 317,951

[22] PCT Filed: Mar. 10, 1981

[86] PCT No.: PCT/FR81/00033
§ 371 Date: Nov. 2, 1981
§ 102(e) Date: Nov. 2, 1981

[87] PCT Pub. No.: WO81/02590
PCT Pub. Date: Sep. 17, 1981

[30] Foreign Application Priority Data

Mar. 11, 1980 [FR] France .................................. 80 05404

[51] Int. Cl.³ ............................................ C30B 23/06
[52] U.S. Cl. ............................ 156/610; 156/DIG. 67; 156/DIG. 82
[58] Field of Search ....... 156/DIG. 82, 610, DIG. 67, 156/611-614; 427/86; 423/491, 96

[56] References Cited

U.S. PATENT DOCUMENTS

| | | | |
|---|---|---|---|
| 3,519,492 | 7/1970 | Huml et al. | 423/96 |
| 4,282,057 | 8/1981 | Faile | 156/DIG. 82 |
| 4,299,649 | 11/1981 | Gentile et al. | 156/610 |

FOREIGN PATENT DOCUMENTS 2276872  7/1974  France ........................ 156/DIG. 82

OTHER PUBLICATIONS

Beinglass et al., J. of Crystal Growth 42, 12/77, pp. 166-170.
Philips Technical Review, Scholz, vol. 28, 1967, No. 10, p. 316.
Schieber et al., J. of Crystal Growth 24/25, 1974, pp. 205-211.

Primary Examiner—Hiram H. Bernstein
Attorney, Agent, or Firm—Neil F. Markva

[57] ABSTRACT

The invention relates to the production of mono-crystals. It concerns a process for the growth of at least one mono-crystal in a cylindrical chamber, comprising a source zone and a well zone, heated to different uniform temperatures. By appropriate regulation of these temperatures, it is possible to nucleate and grow at least one mono-crystal. Application particularly to the production of mono-crystals of $HgI_2$.

13 Claims, 3 Drawing Figures

PROCESS FOR MONO-CRYSTAL GROWTH IN A CLOSED TUBULAR CHAMBER

FIELD OF THE INVENTION

The invention concerns a process for the growth of a mono-crystal in a closed tubular chamber and the mono-crystals, obtained by that process.

BACKGROUND OF THE INVENTION

French Pat. No. 2,276,872 proposed to prepare mono-crystals of $HgI_2$ in an ampoule, maintained under vacuum, produed with the aid of a vacuum pump. The known system comprises three zones: a sublimation zone, containing a charge of polycrystalline $HgI_2$, taken to a temperature sufficiently high for the latter to sublime in the vapor state; an intermediate transfer zone, taken to an essentially constant temperature, higher than that of the sublimation zone; and a zone for the growth of the mono-crystal of $HgI_2$, taken to a temperature lower than, or equal to, that of the sublimation zone. The transfer zone is brought continuously closer to the charge, in proportion to the growth of the mono-crystal. This process is complicated in operation, because it requires the use of a vacuum pump and of a mobile oven, having several windings. Besides, it is difficult to control the different parameters governing the seeding and the growth, so as to obtain mono-crystals without redhibitory structural defects.

Other processes, still more complicated, have been described in French Pat. No. 2,315,994 and U.S. Pat. No. 4,094,268.

There exists, therefore, a need for a process for the production of mono-crystals of good quality and of high purity in a closed chamber, which should be relatively easy to operate, does not require complicated and burdensome equipment and allows for good control of the parameters.

The object of the invention is to provide such a process.

SUMMARY OF THE INVENTION

The invention concerns a process for the growth of at least one mono-crystal, characterized in that:

(A) a source of the compound which is to form the mono-crystal is placed at one end of the ends of a chamber having a generally cylindrical shape. The compound source is selected from a group of compounds that are vaporizable or sublimable or reactive. The vaporizable or sublimable compounds are with or without dissociation, in the vapor state. The reactive compounds are capable of a reversible reaction with a reactive gas so as to yield a gaseous compound.

(B) When the compound source is formed by a vaporizable or sublimable compound, a vacuum is established in the chamber. On the other hand, when the compound source is formed by a reactive compound, the chamber is hermetically closed and filled with a reactive gas.

(C) In either case set forth in (B), the tubular chamber is heated to create in the latter a source zone and a deposit and sink zone in the chamber with the two zones having different uniform temperatures. The source zone includes the compound source and is heated to a temperature $T_s$, at which vaporization or sublimation or reaction of the compound occurs. The deposit and sink zone includes the end of the chamber opposite to the source zone and is heated to a temperature $T_p$ which is lower than $T_s$ with an exothermic process and is higher than $T_s$ with an endothermic process. With the respective temperature relationship in the two zones, the vapor condenses or compound is dissociated, yielding the desired solid compound with deposition of material in a localized sink. The desired solid compound is previously formed from said material or from at least one of the two components of the latter and situated at that end or in the vicinity of the latter. The two zones, having different uniform temperatures, are connected by a transition zone, having a temperature gradient.

(D) The temperature difference $\Delta T$ between the source zone and the sink and deposit zone is regulated to a value effective to cause nucleation of at least one discrete seed to take plae in the deposit zone of the chamber, at a point situated upstream of the sink, and (E) Then, as soon as a seed or seeds appear(s), the value of the temperature difference $\Delta T$ is modified to prevent nucleation of other seeds and to obtain a suitable rate of growth of the mono-crystal or mono-crystals on said seed or seeds.

The sink of material may be formed, for example, just before step (C), by heating the chamber, with the exception of the sink zone, to a temperature much higher than that of the sink zone. This way of developing the sink of material is particularly useful when using a vacuum-sealed glass tube as a cylindrical chamber. If it is practicable, as, for example, in the case of a detachable cylindrical chamber, it would be acceptable to deposit at the sink-end a little of the desired solid compound or, in the case of an alloy, at least one of its components.

Formation of a carefully localized sink before proceeding with the following steps, is useful for preventing the deposited material lining the whole of the deposit and sink zone and for obtaining a regular gas flow.

The process of the invention rests on the establishment of a convection or diffusion system, brought about by the creation of a drop or of drops in partial pressure of the types conveyed, $\delta$ Pi, between the ends of a closed cylindrical chamber, hereinafter simply called "tube", by placing a source $A_s$ and a sink of material $A_p$ in position, respectively kept at different temperatures $T_s$ and $T_p$.

The process is applicable to any transport governed by a reaction of the type:

$$mA_{solid} + nBm_{gas} \rightleftharpoons m(ABn)_{gas} \qquad (1)$$

At the source, there is production of the gaseous source type (ABn).

At the deposit, the solid phase is created with disappearance of the gaseous source type ABn.

Other, more complex, reactions may take place at the source and in the sink.

The process of the invention is applicable to the preparation of mono-crystals of widely differing types. Non-limiting examples are $\alpha$-$HgI_2$, HgSe, CdS, $Pb_xSn_{1-x}Te$, Ge, etc.

Growth of the mono-crystal or mono-crystals may be directly effected on the internal wall of the cylindrical chamber or on a support or platform, arranged in the deposit zone of the chamber. In particular, deposits of mono-crystalline layers of germanium can be formed on suitable substrates, for example of mono-crystalline germanium or of alumina. In the case of a deposit on a substrate, it is most frequently necessary to prepare the substrate by heating the source and deposit zones, so as to direct the impurities, desorbed from the substrate, towards the sink zone, before putting the process of the invention into operation.

A concurrent sublimation/condensation reaction is a particular case, for which no gaseous component B is necessary for the transport of the solid phase A. In this case, there is simply $A_{solid} \rightleftarrows A_{gas}$ at the source and $A_{gas} \rightleftarrows A_{solid}$ on the deposit.

α-HgI$_2$ is a particularly interesting example of such a concurrent sublimation/condensation reaction.

In the case of α-HgI$_2$, step (E) advantageously consists in reducing the temperature difference ΔT, established in step (D), from the moment of the appearance of a discrete seed or discrete seeds. This prevents nucleation of other seeds. The reduced temperature difference is continued until the mono-crystal or mono-crystals, developing on the seed or seeds, reach a volume of at least 1 mm$^3$, approximately. Then that temperature difference is finally increased to increase the rate of growth of the mono-crystal or mono-crystals.

According to a variant of putting the process of the invention into practice, the deposit and sink zone is divided into two separate zones, i.e. a deposit zone and a sink zone. The two zones are heated to different uniform temperatures T$_d$ and T$_p$, respectively, the deposit zone being located between the source zone and the sink zone and the relationship T$_s$>T$_d$>T$_p$ being satisfied in the case of an exothermic process and the relationship T$_s$>T$_d$>T$_p$ in the case of an endothermic process. With this variant, steps (D) and (E) apply to the temperature difference existing between the source zone and the deposit zone.

Apart from the essential materials described above, it is possible, if desired, to introduce into the chamber an inert additional gas, intended to enable the concentration gradient between the source and the sink to be controlled and thus the diffusion flow of the type transported to be regulated.

BRIEF DESCRIPTION OF DRAWINGS

Other objects of this invention will appear in the following description and appended claims, reference being made to the accompanying drawings forming a part of the specification wherein like reference characters designate corresponding parts in the several views.

DETAILED DESCRIPTION

Figure 1:
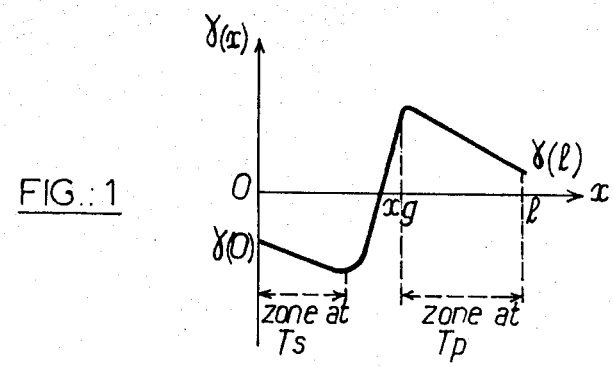
FIG. 1 is a diagram, illustrating the supersaturation curve for the vapor phase as a function of the distance from the source when using an oven having two heating zones.

FIG. 1 illustrates a typical profile of the relative supersaturation curve γ (x) as a function of the distance x from the source, for the case of the use of an oven having two zones. γ (x), for the case of a concurrent sublimation/condensation reaction, is equal to the expression $$\gamma(x) = \frac{P(x)}{Pe(Tx)} - 1$$

where

Pe(Tx)=equilibrium pressure at temperature T at the distance x from the source=K(Tx) (equilibrium constant); and P(x)=partial pressure of the sublimated compound at point x. For the case of a chemical reaction, there is $$\gamma(x) = \frac{P(ABn)^m}{P(Bm)^n K(Tx)} - 1$$

where K(Tx)=equilibrium constant of the reaction (1) at temperature Tx and P(ABn)$^m$ and P(Bm)$^n$ are the partial pressures of the components ABn and Bm. For given values of T$_s$ and T$_p$, the maximum value of γ increases in inverse proportion to the distance from the mean position x$_g$ of the gradient, therefore by reduction of the length of the source zone. Similarly, for given values of T$_s$, T$_p$ and x$_g$, this maximum value will decrease in inverse proportion to the length of the tube. An oven, having two zones, therefore, makes it possible (1) to regulate the rate of gas flow by the choice of T$_s$−T$_p$, of the length and of the radius of the tube and of the surfaces of the source and of the sink; and (2) to regulate the frequency of nucleation and the kinetics by the choice of the preceding parameters, of T$_p$ and of the position x$_g$ of the temperature gradient. γ (x) reaches its maximum value at the beginning of the deposit zone and the frequency of nucleation and the kinetics of growth will thus be highest at that point.

In case the equilibrium constant K(Tx) does not sufficiently vary with temperature, it will be preferable to use an oven, having three isothermal zones: a source zone at T$_s$, a deposit zone at T$_d$ and a sink zone at T$_p$. The rate of gas flow will depend on the five parameters, T$_s$−T$_p$, R, l, S$_s$ and S$_p$.

γ (x)=γ (0)<0, for x=0, decreases to a value that is the more negative, the greater the distance of the mean position x$_g$ of the gradient, separating the source and deposit zones, is from the source. It rises subsequently as the result of the decrease of K(T), from the value K(T$_s$) to the value K(T$_d$), to a value that is the higher, the lower x$_g$ is, and subsequently decreases. Subsequently, it rises again in the zone of the second gradient and decreases again to a value γ (l). If the difference between the temperatures of the deposit and sink zones is large, the second gradient will be extended. It will therefore be appropriate to choose a sufficiently long tube for maintaining an isothermal deposit zone.

Figure 2:
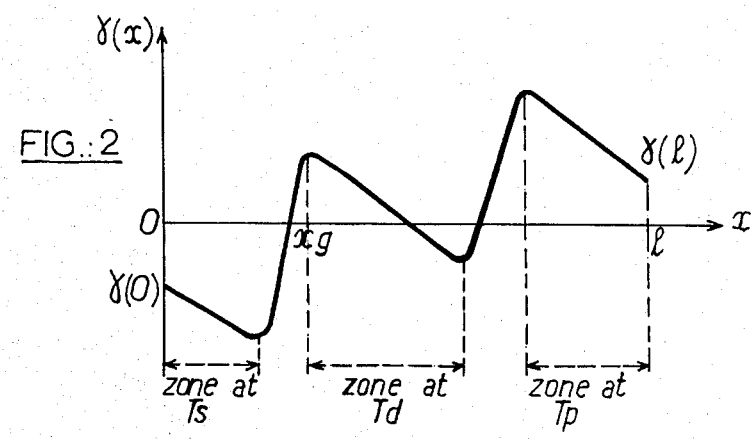
FIG. 2 is a diagram similar to that of FIG. 1, but when using an oven having three heating zones.

FIG. 2 illustrates a typical profile of the curve γ (x) as a function of x when using an oven having three zones. The frequency of nucleation and the kinetics of growth depend on γ (x) and T$_d$. The three zones oven thus enables the rate of gas flow and the kinetics of nucleation and of growth to be independently regulated by independent choice of T$_s$−T$_p$ and of T$_s$−T$_d$.

In practice, it will be possible, for example, to operate, as follows, in the case of a concurrent sublimation/condensation reaction.

Case of an Oven Having Two Zones

In the first place, source and sink material is introduced into the tube. The diameter of the tube will be chosen according to the limit of the process. That limit is obtained when the crystal has a surface such that it takes about half the material originating from the source. It thus depends on the surface of the source and on that of the sink. Choice of a source and sink surface at least equal to the surface of the desired crystal is a satisfactory guarantee. Similarly, the choice of the section of the tube must be such that the desired crystal does not obstruct more than a quarter of the section. For a tube of 18 mm in diameter, the size of a cubic crystal must not be higher than from 4 to 5 mm side. The length of the tube must be sufficient for obtaining large flow and not too high a maximum supersaturation. Preliminary tests are necessary.

The material, which is to constitute the source and the sink, is introduced into the tube sealed under adequate vacuum. It is placed at one end of the tube. The tube is then placed into an oven, having two heating zones, for example an oil circulation oven or a thermoconductor oven, the end of the tube without material being placed into the less high temperature zone. The sink is built up by transport of material from the source zone toward the sink zone at a large temperature difference $T_s - T_p$. Other methods are feasible for building up the well, see Example 1.

Nucleation tests are then carried out, so as to choose a temperature difference $T_s - T_p$, which enables a number of discrete seeds to be obtained, spaced at a distance at least equal to the size of the crystals to be developed. The seeds are located at the beginning of the deposit and sink zone, at the point, where $\gamma(x)$ reaches its maximum value. The number of seeds created has to remain constant for some days, i.e. until they have a sufficiently large size for the quantity of material, absorbed by growth, to impoverish sufficiently the environment of the crystals.

Following these tests, the experiment is repeated, starting with a zero temperature difference and increasing it, little by little, to a value lower than, or equal to, that of the tests. As soon as discrete germs appear, the difference is slightly reduced. The time of appearance may range from one hour to more than a day. The values of $T_p$ and of $\Delta T$ enable the frequency of nucleation to be controlled. As long as the crystal or crystals do not come to more than about 1 mm$^3$, conditions are maintained unchanged. Afterwards, the difference $\Delta T$ is increased, so as to increase the gas flow. The limiting size appears when the surface of the crystal is attacked on the side turned toward the sink. It is then indicated to stop the heating. If growth were continued, the front faces of the crystal would then continue to grow, while the rear faces would wear away.

The experiments, in the same conditions of pressure of active or inert compounds, are reproducible for an identical value of the parameters: surface of the source, of the sink, length of the tube and position of the transition zone ($x_g$).

Case of an Oven Having Three Zones

In this case, the first step is to establish a temperature difference $T_s - T_p$, giving a sufficient rate of condensation in the sink zone, for example of more than 0.5 mm thickness per day. This determination can be made, for example, by placing a crystal in the sink zone and measuring its rate of growth or, alternatively, by placing a glass support, coated with mono-crystals, and measuring the quantity deposited, this on control tubes. When this has been done, the nucleation tests are carried out by finding the difference between the temperatures of the source $T_s$ and of the deposit $T_d$ in the same way as for the two-zone oven.

These tests are carried out for a given rate of gas flow. The nucleation of discrete seeds with the highest flow rate can thus be found from the differences $T_s - T_p$ and $T_s - T_d$. Moreover, that flowrate may be increased by increasing $T_s - T_p$. Readjustment of $T_d$ may then prove to be necessary, so as to avoid too rapid deposition or attack of the crystal or crystals, as the case may be. The possible limiting size thus is higher than that of a two-zone oven. The use of a three-zone oven represents a preferred working method, especially for production on an industrial scale.

The process of the invention can be applied with the cylindrical chamber in horizontal or vertical position. The term "cylindrical chamber" has to be taken in a wide sense and simply means that the major part of the chamber has a cylindrical shape. It is not excluded, in particular, that the terminal parts of the chamber, containing the source and the sink, have a different shape from that of the remainder of the chamber. The chamber may be simply formed by a vacuum-sealed glass tube or by elements, which can be assembled and are equipped with sealed joints and the valves, required for the working of the assembly.

The process of the invention may be applied, as has been said, to vaporizable or sublimable compounds or to solid compounds capable of undergoing a reversible reaction with a reactive gas, yielding a gaseous compound.

The processs of the invention is particularly useful for the production of mono-crystals of $\alpha$-HgI$_2$, which are convenient of X-ray and $\gamma$-ray detectors. In the case of $\alpha$-HgI$_2$, the temperature $T_s$ used must clearly not exceed the temperature of transformation into $\beta$-HgI$_2$. It has been found that, for $\alpha$-HgI$_2$, a temperature $T_s$ lying within the range of from 50° to 125° C. and a temperature difference between the source and deposit zones ranging from 0.1° C. (in step (E)) to about 10° C. can be used.

The chamber has to be carefully cleaned and the compound, forming the source, has to be carefully purified, so as to prevent the mono-crystal containing an undesirable proportion of impurities. The vacuum, produced in the chamber in step (B), has to be very high, for example of the order of $10^{-7}$ torr.

The following non-limiting examples are given for illustrating the invention.

EXAMPLE 1

Preparation of a monocrystal of mercuric iodide of $\alpha$-configuration

Figure 3:
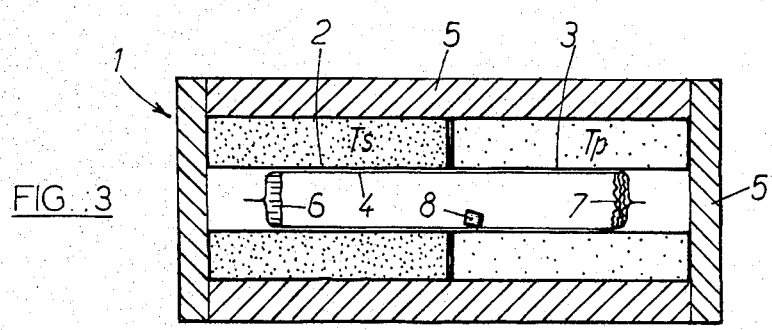
FIG. 3 is a schematic view illustrating the operation of the process of the invention.

A unit, such as represented in FIG. 3, was used in this example. This unit essentially comprised a glass oven 1 with thermostatically controlled oil circulation, comprising two heating zones 2 and 3, having the same length, conforming to the shape of the tubular chamber 4. This latter consisted of a simple glass tube, sealed at its two ends and being arranged horizontally. The whole was carefully covered with heat-insulating material 5, so as to avoid any disturbance coming from the outside. The mercuric iodide used is a 99% commercial mercuric iodide, purified by at least three successive sublimations in a glass ampoule, sealed at $10^{-6}$ torr at ambient temperature, the ampoules having been cleaned with "DECON 90" (a decontamination solution) and rinsed with the vapor of re-distilled water for 12 hours at the start.

The tubular chamber used had a diameter of 15 mm and a length of 150 mm and had been cleaned with DECON 90 and rinsed with the vapor of re-distilled water for 12 hours.

20 g of purified $HgI_2$ were placed at one of the ends of the tubular chamber; then, before finally sealing the tube, it was degassed with a vacuum pump for several days.

The source and sink depositions 6 and 7 were then made by carrying out two successive sublimation/condensation operations, each of the ends playing the part, in succession, of the source ("hot" zone) and of the sink ("cold" zone). The product adheres to the ends of the tube and shows a micro-crystalline appearance. The sublimation and condensation surfaces depend on the temperature difference used and may be increased by means of Vigreux pins, provided at the two ends of the tube. In the case of the present example, the surfaces of the source and of the sink were similar and equal to 23.5 mm², approximately.

After the preparation of the source and sink deposits, the source zone was then heated to 107° C. ($T_s$) and the deposit and sink zone to 105° C. ($T_p$). The time of the appearance of a seed on the tube wall in the vicinity of the beginning of the deposit and well zone is from 12 to 24 hours.

Once the crystal 8 has reached a volume of about 1 mm³, $\Delta T$ was taken to 7° C. by reducing $T_p$ to 100° C. The limiting size of the crystal appears with 4.5 mm side. The rate of growth of the crystal was from 0.2 to 0.3 mm per day.

EXAMPLE 2

Example 1 was repeated, but a tubular chamber of larger diameter (25 mm) and of the same length (150 mm) was used.

In this case, the limiting size of the mono-crystal is of the order of from 7 to 8 mm side.

It should be noted that, instead of effecting the nucleation and the growth of the mono-crystal on the internal wall of the tube, these could be effected on a support or platform, arranged in the axis of the tube, particularly in case the chamber is vertically arranged.

EXAMPLE 3

In this example, the procedure was as in Example 1, but the oven employed comprised three heating zones and the cylindrical chamber consisted of a tube 30 cm long and 30 mm in diameter. The source zone took up 8 cm in length and was at 115° C.; the deposit zone took up 15 cm in length and was at 112.8° C.; and the sink zone took up 7 cm in length and was at 105° C.

It was possible to obtain a mono-crystal of $7 \times 4 \times 17$ mm.

EXAMPLE 4

Preparation of mono-crystals of $Pb_{0.8}Sn_{0.2}Te$

A two-zone oven as in Example 1 was used. With temperatures $T_s = 820°$ C. and $T_p = 815°$ C., 4 mono-crystals of from 4 to 10 mm side could be obtained at the end of six days.

Evidently, the embodiments described are merely examples and could be modified, particularly by substituting equivalent technical means, without thereby falling outside the scope of the present invention.

We claim:
1. A process for the growth of at least one mono-crystalline structure, said process comprising the steps of:
    (a) providing in a source zone of a chamber a source of the material which is to form the mono-crystalline structure,
    (b) said material source being vaporizable or sublimable, with or without disassociation, in the vapor state,
    (c) hermetically closing the chamber and establishing a vacuum in the chamber,
    (d) heating the source zone including the material source to a temperature $T_s$ at which temperature the vaporization or sublimation of the material in the material source occurs,
    (e) heating a portion of the chamber outside the source zone to a temperature $T_p$ to form a deposit and sink zone in the chamber,
    (f) said temperature $T_p$ being at which vapor of the vaporizable or sublimable material condenses to deposit the mono-crystalline solid material in the deposit and sink zone,
    (g) the source and deposit and sink zones having a temperature difference $\Delta T$ and being connected by a transition zone having a temperature gradient,
    (h) regulating said temperature difference $\Delta T$ to a value effective to nucleate at least one discrete seed in the deposit zone of the chamber at a point located upstream of the sink zone, and
    (i) modifying the value of the temperature difference $\Delta T$ as soon as said seed appears to prevent nucleation of other seeds and to obtain a suitable rate of growth of the mono-crystalline structure.
2. A process as defined in claim 1 wherein the compound source is a sublimable solid compound.
3. A process as defined in claim 2 wherein the compound source is $\alpha$-$HgI_2$.
4. A process as defined in claim 3 wherein the modifying step includes reducing the temperature difference $\Delta T$ from the moment of the appearance of said discrete seed to prevent nucleation of other seeds, and continuing until the mono-crystalline structure developing on the seed reaches a volume of at least about 1 mm³, and then finally increasing that temperature difference $\Delta T$ to increase the rate of growth of the mono-crystalline structure.
5. A process as defined in claim 1 wherein the process within the chamber is exothermic and therefore the temperature $T_p$ is established lower than temperature $T_s$.
6. A process as defined in claim 1 wherein the process within the chamber is endothermic and therefore the temperature $T_p$ is established higher than temperature $T_s$.
7. A process as defined in claim 1 wherein the deposit and sink zone is divided into a deposit zone and a sink zone, being separate and heated to different uniform temperatures $T_d$ and $T_p$, respectively, the deposit zone being located between the source zone and the sink zone and the relationship $T_s > T_d > T_p$ being satisfied.
8. A process for the growth of at least one mono-crystalline material, said processing comprising the steps of:
    (a) providing in a source zone of a chamber a source of the material which is to form the mono-crystalline,

(b) said material source being a reactive material capable of a reversible reaction with a reactive gas so as to yield a gaseous compound, (c) hermetically closing the chamber and filling the chamber with a reactive gas, (d) heating the source zone including the material source to a temperature $T_s$ at which temperature the reaction of the material in the material source occurs with the reactive gas which fills the chamber, (e) heating a portion of the chamber outside the source zone to a temperature $T_p$ to form a deposit and sink zone in the chamber, (f) said temperature $T_p$ being at which the gaseous compound formed by said reversible reaction is disassociated to deposit the mono-crystalline solid material in the deposit and sink zone, (g) the source and deposit and sink zones having a temperature difference $\Delta T$ and being connected by a transition zone having a temperature gradient, (h) regulating said temperature difference $\Delta T$ to a value effective to nucleate at least one discrete seed in the deposit zone of the chamber at a point located upstream of the sink zone, and (i) modifying the value of the temperature difference $\Delta T$ as soon as said seed appears to prevent nucleation of other seeds and to obtain a suitable rate of growth of the mono-crystalline material.

9. A process as defined in claim 8 wherein the reactive material is germanium.

10. A process as defined in claim 9 wherein a mono-crystalline layer of germanium is deposited on a substrate.

11. A process as defined in claim 8 wherein the deposit and sink zone is divided into a deposit zone and a sink zone, being separate and heated to different uniform temperatures $T_d$ and $T_p$, respectively, the deposit zone being located between the source zone and the sink zone and the relationship $T_s > T_d > T_p$ being satisfied.

12. A process as defined in claim 1 wherein the chamber is formed by an elongated cylindrical tube, the source zone is at one end of the tube and a sink zone is located at the other end of the tube, and a deposit zone is located intermediate of the two ends of the tube.

13. A process as defined in claim 8 wherein the chamber is formed by an elongated cylindrical tube, the source zone is at one end of the tube and a sink zone is located at the other end of the tube, and a deposit zone is located intermediate of the two ends of the tube.

* * * * *